METHOD OF DESCUMMING PHOTORESIST PATTERNS

Filed Sept. 18, 1970

INVENTORS
G.L.CHRISTENSEN
D.H.GITTELMAN
BY
ATTORNEY

United States Patent Office 3,705,055
Patented Dec. 5, 1972

3,705,055

METHOD OF DESCUMMING PHOTORESIST PATTERNS

Gary Lee Christensen and Donald Henry Gittelman, Reading, Pa., assignors to Western Electric Company, Incorporated, New York, N.Y.

Filed Sept. 18, 1970, Ser. No. 73,486
Int. Cl. B44d *1/18;* B08b *7/00*
U.S. Cl. 117—212 1 Claim

ABSTRACT OF THE DISCLOSURE

Residual portions of photoresist are removed from areas of a pattern which are to be free of photoresist. The removal or "descumming" is accomplished by subjecting substrates with patterned coatings of photoresist to an oxidizing medium, such as oxygen plasma, for a brief period. The residual photoresist or "scum" is removed while the desired photoresist is reduced in thickness. The time of oxidation is limited so that the desired photoresist is not made excessively thin.

BACKGROUND OF THE INVENTION

Field of the invention

The invention relates to a method of descumming photoresist patterns. More particularly, the invention relates to a method of removing by oxidation residual portions of photoresists from areas of a pattern which are to be free of photoresist.

Description of the prior art

The field of actinic pattern production with photoresist is plagued with a problem known as "scumming". "Scumming" is a term used to describe a condition in which areas of a pattern which are to be free of photoresist are not entirely clear.

Usually, it is desirable to limit the presence of a photoresist to only selected areas of the substrate and to have other areas of the substrate completely free of the photoresist. At times, however, the areas which are to be free of resist are not entirely clear. It has been found, in many of these cases, that the material which is remaining in the supposedly free areas is, in fact, a scum formed of the basic organic material of the photoresist.

There are many explanations for how and why the scum forms. As expressed by A. Engvall in a paper entitled "Photochemical Smog as a Cause of Resist Scum" presented at the Kodak Photoresist Seminar in May of 1969, the scum may be produced by the action of smog components on the organic material of the photoresist to cause partial polymerization. Such partially polymerized portions of photoresist do not wash away during normal development and, thus, a scum of the material is left behind after developing.

As mentioned in the paper by A. Engvall, the scum appeared to be partially polymerized and insolubilized resist and tended to remain after removal of the photoresist. Various solvents and solvent combinations were tried for development of the photoresist to get rid of the scum, but none would remove it. Although a forceful spray of active solvent did produce some results, it was not adequate in severe cases of scumming and sometimes caused minor lifting.

In the application of photoresists there is often a baking cycle used to drive out solvents of a photoresist after application to a substrate. During this baking process there is often a thermal decomposition of oxidants which have entered the photoresist system as smog components. It is thought that this decomposition of oxidants forms undesirable radical generators which initiate polymerization and, thus, operate to produce scum which remains after development.

The elimination of scum is important in virtually every area in which photoresists are used. The printing industry has long been faced with scumming problems. When photoresists are used in the selective etching of printing plates, scum often develops in the supposedly clear areas of the plate after development. This scum is usually removed by partial etching of the material in the clear areas. Such partial etching causes vigorous activity in the clear areas and, as a result, lifts and removes the scum from these areas so that the final pattern-formation etching can take place on a uniformly clear area.

The problem of scum formation, however, is particularly acute in the area of integrated-circuit and semiconductor technology wherein line widths are extremely small and nonuniformity of etching or plating within a scum-contaminated area can result in a complete nonfunctioning of an integrated circuit or a semiconductor device. Problems associated with scumming during the manufacturing of integrated circuits are discussed in a paper entitled "Detection of Wafer Contamination" presented by Mary Lundgren Long and S. A. Harrel at the Kodak Photoresist Seminar held in May of 1969. Such problems are also discussed in the aforementioned paper by A. E. Engvall.

As noted in the paper entitled "Detection of Wafer Contamination," particulate matter or dust on the slice during photoresist processing can result in scum in areas where the resist should develop off—thereby causing undesirable oxide islands. Further, any organic scum such as residual resist or solvent, which is formed during photoresist processing, can cause pitting of the slice and poor adhesion to the slice during subsequent processing of the slice.

Attempts have been made to remove scum by forceful impingement of developing solution onto a substrate. Such a technique is only partially effective. It also carries with it an inherent risk of tearing away the photoresist from the desired portions of the substrate leaving these portions exposed to whatever chemical medium they were to be protected from.

Descumming by etching of a metal in scum-contaminated areas as practiced by the printing industry cannot be utilized in the integrated circuit and semiconductor fields. Such vigorous etching which lifts scums also has too great a potential for lifting the delicate patterns of the desired photoresist. Such a lifting of the desired photoresist would again result in unprotected areas of the underlying substrate and consequent circuit failure.

Elaborate attempts have also been made to prevent the formation of scums on integrated circuits particularly because their removal is virtually impossible. Some manufacturers of integrated circuits have proposed using certain photoresists only during limited portions of a day when smog levels are low. Such limitations, of course, reduce the efficiency of a manufacturing operation.

Other manufacturers have limited their use of photoresist to those resists which are less susceptible to the undesired polymerization that occurs by the presence of smog components and water vapors. Such an approach to elimination of scumming reduces the flexibility of a manufacturing operation because some photoresist which are susceptible to smog formation have very desirable properties that a manufacturer must forego if he precludes the use of these photoresists.

SUMMARY OF THE INVENTION

It is an object of the invention, therefore, to provide a method of descumming intricate patterns formed in a photoresist coated on a substrate.

It is a further object of the invention to accomplish such descumming without disturbing the desired protective covering of a pattern of polymerized photoresist.

It is still another object of the invention to provide a method of descumming which is applicable to substantially all forms of organic photoresists so that susceptibility to scumming does not preclude the use of some resists which may have desirable properties.

These and other objects are achieved by exposing a substrate, on which a patterned polymerized photoresist has been applied, to an oxidizing medium for a brief period of time so that any scum remaining on uncoated areas of the substrate is completely oxidized and removed while only a fractionl thickness of the desired coating of polymerized photoresist is removed.

BRIEF DESCRIPTION OF THE DRAWINGS

Other objects and features of the present invention will be more readily understood from the following detailed description of specific embodiments thereof when read in conjunction with the appended drawings in which.

DETAILED DESCRIPTION

Illustratively, the invention will be described in connection with photoresist used to mask portions of a substrate of platinum on which a gold interconnection pattern is to be plated. Such gold connection patterns are typically used in beam-lead integrated circuits. It is to be understood, however, that the invention is applicable to a far wider range of pattern production activities than those which arise in the semiconductor industry.

Figure 1:
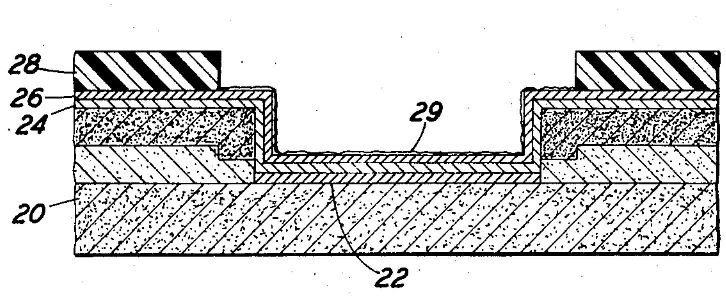
FIG. 1 is a cross-sectional view of a portion of a substrate showing a full thickness of polymerized photoresist and an uncoated area having organic scum formed thereon.

FIG. 1 shows a silicon substrate 20 in an area of a contact window. A platinum silicide contact 22 is formed within the window, a layer 24 of titanium is formed across the entire substrate 20. A platinum interface 26 is applied on the titanium layer 24 and a photoresist layer 28 is applied on the platinum to define the pattern. A residual portion of photoresist or "scum" 29 remains in the contact window area.

It is desired to plate gold on the exposed portion of the platinum in order to form an interconnection pattern on the substrate 20. A detailed discussion of the manufacturing of integrated-circuit chips of which the substrate 20 is a portion can be had by referring to an article by S. S. Hause and R. A. Whitner, "Manufacturing Beam-Lead, Sealed Junction Monolithic Integrated Circuits," The Western Electric Engineer, December 1967, vol. XI, No. 4, pp. 3–15.

The photoresist layer 28 is preferably KPR–2 available from Eastman-Kodak Co., New York. KPR type resists are generally formed of polyvinyl cinnamate copolymerized with polyvinyl alcohol. Such polyvinyl alcohol type resists have been found to be particularly susceptible to scumming caused by smog components or moisture contamination. The use of these resists by some semiconductor manufacturers has been reduced because of this susceptibility.

However, it is desirable to use polyvinyl alcohol type photoresists on platinum surfaces and other semiconductor applications because of the particularly good adhesion that can be obtained with such resists. The mechanism of this adhesion is discussed in a co-pending application for patent, now abandoned, Ser. No. 14,677, filed Feb. 26, 1970 in the name of D. H. Gittelman and assigned to the assignee of this application. It is quite clear that maximum adhesion will produce minimum probability for underplating and will thus result in extremely good line definition. Since the lines are in the order of 0.0002 inch, good definition is essential. Thus, even though the polyvinyl alcohol resists are very desirable in some applications their susceptibility to scumming has heretofore prevented their widespread use in these applications. As discussed previously, it is thought that the scum is produced by some preliminary and undesired polymerization of the photoresist which takes place because of a presence of radical generators produced by thermal or photolytic decomposition of oxidants. Whatever the cause, however, the scum 29 occurs and its presence precludes a uniform deposition of gold on the platinum 26.

The very delicate structure associated wtih line widths as low as 0.0002 inch is not very tolerant to mechanical abuse that would be required to remove the scum 29 with a pressurized developing operation. Nor, would any physical scraping or brushing of the scum 29 be practical. Heretofore, the occurrence of scum in the undercoated areas has been resolved by stripping all of the photoresist 28 in hopes that a reapplied resist would be free of scum 29.

Figure 2:
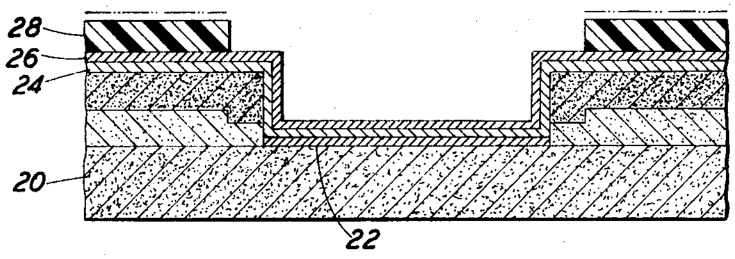
FIG. 2 is a view of the substrate of FIG. 1 after oxidation removal of the scum showing a fractional reduction in thickness of the remaining polymerized photoresist.

It has been discovered, however, that such reapplications of the photoresist 28 are not required when the scum 29 develops. Instead, the entire substrate 20 can be subjected to an oxidizing medium in which the organic scum 29 becomes completely oxidized into water vapor and carbon dioxide both of which are, of course, readily removable from the substrate. An oxidizing medium will, of course, attack the outer surface of the desired photoresist layer 28 and will oxidize a fractional thickness of that photoresist. However, a controlled exposure to an oxidizing medium will result in an elimination of the scum 29 without an adverse reduction of the thickness of the resist 28, as shown in FIG. 2.

Various forms of oxidation can be used. The substrate can be subjected to ozone treatment or treatment within an oxygen plasma at an elevated temperature. These are only two examples of workable sources of activated oxygen atoms which can be reacted readily with the organic materials of the scum 29.

It is important to use a temperature which will not cause a rapid and general deterioration of the desired photoresist. Use of activated oxygen such as nascent oxygen generated in a plasma or ozone results in the desired elimination of scum at a low enough temperature to preclude deterioration of the desired photoresist. In general, it is preferable to maintain the temperatures of the descumming operation below 150° C.

It is possible, however, to permit a temperature of up to 250° C. to exist in a descumming environment if the period of exposure is limited to less than one minute.

Example

In an example of the use of the inventive oxidizing descumming technique, a substrate coated with platinum was cleaned in cold aqua regia (3:1, hydrochloric acid and nitric acid) for 30 seconds, the substrate was rinsed in a deionized water cascade fo 5 minutes. It was then dried and baked in a clean nitrogen ambient at 165° C. for 30 seconds.

KPR–2 photoresist was applied on a conventional spinner at 3000 r.p.m. for 20 seconds. The coated substrate was baked in a clean nitrogen ambient at 90° C. for 30 minutes. A mask was applied over the photoresist coating and the resist was exposed for 10 seconds with a conventional actinic light source. The substrate was hand-developed with the following cycle:

three minutes in KPR–2 developer available from Eastman-Kodak
ten seconds in isopropyl alcohol
five seconds in a first acetone bath
five seconds in a second acetone bath
ten seconds in chloro-fluorinated hydrocarbon (Electronic grade).

The substrate with the remaining photoresist was baked in a clean nitrogen ambient at 115° C. for 30 minutes. The substrate was then placed in an oxygen plasma in a quartz boat. The particular plasma generator used was designated as Plasma Machine 1101 available from International Plasma Corporation, Hayward, Calif. The plasma machine was operated at a power level of 1000 watts RF with an oxygen flow rate of 700 cc. per minute. Initial start up vacuum was 0.3 torr and operating vacuum with oxygen was 8.0 torr. The substrates were exposed to the plasma for 30 seconds.

After removal from the plasma machine gold plating was performed according to normal practices without any instances of nonuniformity due to presence of scum.

Although certain embodiments of the invention have been shown in the drawings and described in the specification, it is to be understood that the invention is not limited thereto, is capable of modification and can be arranged without departing from the spirit and scope of the invention.

What is claimed is:

1. A method of producing fine line patterns on a semiconductor substrate, said patterns having line widths of about 0.0002 inch, which comprises the steps of:

coating said substrate with a polyvinyl alcohol type photoresist;

selectively exposing the photoresist to actinic light in a fine line pattern;

developing the exposed photoresist to fix the fine line pattern;

washing the coated substrate to remove the developed photoresist so that clear openings are produced in the photoresist, the clear openings being at least partially covered by an organic scum residue remaining from the removed photoresist;

exposing the entire substrate to an oxygen plasma at a pressure less than atmospheric pressure to initiate oxidation of both unexposed photoresist and the organic scum residue;

heating the entire substrate to a temperature less than 250° C. to facilitate the oxidation without rapid thermal deterioration of the unexposed photoresist;

interrupting the exposure of the substrate to the oxygen plasma after an exposure time of less than one minute so that all of the organic scum residue is completely oxidized thereby forming water and carbon dioxide, the exposure time being of sufficient duration to oxidize only a fractional thickness of the unexposed photoresist;

removing the water formed during the oxidation from the substrate so that the clear openings in the photoresist are completely free of both organic scum residue and water;

subjecting the substrate to a plating bath whereby the substrate within the clear openings is uniformly plated with an adherent metal coating; and washing the plated substrate to remove the unexposed photoresist so that an adherent metal coating remains in the fine line pattern.

References Cited

UNITED STATES PATENTS

| | | | |
|---|---|---|---|
| 3,175,907 | 3/1965 | Fishman | 156—13 |
| 3,542,612 | 11/1970 | Cashau | 156—13 |
| 3,146,336 | 8/1964 | Whitacre | 134—19 |
| 3,236,707 | 2/1966 | Lins | 219—121 LM |
| 2,870,704 | 11/1958 | Goldberg et al. | 96—33 |
| 3,469,980 | 9/1969 | Herman et al. | 96—36.3 |

OTHER REFERENCES

Burrage et al. Photoreist Removal in Ozone containing Atmospheres I.B.M. Technical Disclosure p. 1260, vol. 10, No. 8 1/68.

Tsui et al. Removal of Polymerized Photoresists. I.B.M. Tech. Disclosure p. 1228, vol. 9, No. 9 Feb. 1967.

ROBERT F. BURNETT, Primary Examiner

R. J. ROCHE, Assistant Examiner

U.S. Cl. X.R.

117—93.1 GD, 93.31, 131; 134—2, 19; 156—2; 96—36.3